(12) United States Patent
Sakai et al.

(10) Patent No.: US 6,196,138 B1
(45) Date of Patent: Mar. 6, 2001

(54) MOVABLE TABLE UNIT

(75) Inventors: Junichi Sakai; Yoichi Fukasawa; Satoru Okamura, all of Tokyo (JP)

(73) Assignee: THK Co., LTD, Tokyo (JP)

( * ) Notice: Subject to any disclaimer, the term of this patent is extended or adjusted under 35 U.S.C. 154(b) by 0 days.

(21) Appl. No.: 09/291,379

(22) Filed: Apr. 14, 1999

(30) Foreign Application Priority Data

Apr. 15, 1998 (JP) .................................................. 10-105181

(51) Int. Cl.$^7$ .................................................. A47B 85/00
(52) U.S. Cl. ........................ 108/22; 108/140; 108/143; 74/490.08
(58) Field of Search ................................ 108/22, 20, 137, 108/139, 140, 143; 74/490.08

(56) References Cited

U.S. PATENT DOCUMENTS

| | | | |
|---|---|---|---|
| 3,155,383 | * | 11/1964 | Whitmore ............................ 108/143 |
| 4,729,536 | * | 3/1988 | Scala ................................. 108/143 X |
| 4,988,261 | * | 1/1991 | Blatt ................................. 108/143 X |
| 4,993,673 | * | 2/1991 | Hirose .............................. 108/143 X |
| 5,117,761 | * | 6/1992 | Kasai et al. ........................... 108/22 |
| 5,323,712 | * | 6/1994 | Kikuiri ......................... 74/490.08 X |
| 5,456,134 | * | 10/1995 | Bouwer et al. ................. 108/143 X |
| 5,481,936 | * | 1/1996 | Yanagisawa ...................... 74/490.08 |
| 5,804,932 | * | 9/1998 | Yanagisawa ..................... 108/143 X |
| 5,980,192 | * | 11/1999 | Arai ................................. 108/143 X |

FOREIGN PATENT DOCUMENTS

| | | | |
|---|---|---|---|
| 62-282294 | 12/1987 | (JP) . | |
| 1-240246 | 9/1989 | (JP) . | |
| 1-242989 | 9/1989 | (JP) . | |
| 0024032 | * 1/1990 | (JP) | ..................................... 108/143 |
| 2-202031 | 8/1990 | (JP) . | |
| 3-56895 | 3/1991 | (JP) . | |
| 4-2435 | 1/1992 | (JP) . | |
| 4-210347 | 7/1992 | (JP) . | |
| 4-354637 | 12/1992 | (JP) . | |
| 5-77125 | 3/1993 | (JP) . | |
| 6-31563 | 2/1994 | (JP) . | |
| 406117513 | * 4/1994 | (JP) | ..................................... 108/140 |
| 7-219636 | 8/1995 | (JP) . | |
| 8-99243 | 4/1996 | (JP) . | |
| 2515316 | 8/1996 | (JP) . | |
| 8-211173 | 8/1996 | (JP) . | |
| 8-252733 | 10/1996 | (JP) . | |
| 9-42405 | 2/1997 | (JP) . | |
| 9-155666 | 6/1997 | (JP) . | |
| 9-216138 | 8/1997 | (JP) . | |

* cited by examiner

Primary Examiner—Peter M. Cuomo
Assistant Examiner—Hanh V. Tran
(74) Attorney, Agent, or Firm—Arent Fox Kintner Plotkin & Kahn, PLLC

(57) ABSTRACT

A movable table unit capable of carrying out an operation for rotating a movable table at a position other than an original point and an operation for moving it in parallel after rotating at a predetermined angle by a simple control, capable of moving the rotation center linearly along two axes easily, and further moving the movable table largely along a single axis, is provided. The movable table unit for achieving this object comprises a table base plate, a movable table supported movably on the table base plate, a plurality of moving members joined to a bottom surface of the movable table, a plurality of two-axis guiding systems for guiding each of the moving members along two axes intersecting with each other on the table base plate and for guiding largely along an axis, rotation systems for supporting the movable table or moving members rotatably relative to each of the two-axis guiding systems and a plurality of driving systems for moving each of the moving members selectively along any one of the two axial directions so as to provide the movable table with a linear motion along the two axes and for providing the movable table with a rotation motion around an axis perpendicular to the table base plate.

5 Claims, 13 Drawing Sheets

MOVABLE TABLE UNIT

BACKGROUND OF THE INVENTION

1. Field of the Invention

This invention relates to a movable table unit for use in a precision printing machine, a precision processing machine, a precision manufacturing machine or the like, and more specifically to a movable table unit which is mounted movably relative to a table base plate along two axes intersecting each other and rotatably relative to an axis perpendicular to a plane formed by the two axes.

2. Description of the Related Art

As a movable table unit for use in the aforementioned precision printing machine, a precision processing machine, a precision manufacturing machine or the like, so-called XY table in which a movable table is mounted movably relative to a table base plate along two axes intersecting each other has been often used.

Conventionally, as a movable table unit for use in the precision printing machine, the precision processing machine, the precision manufacturing machine or the like, so-called XY table in which a movable table is mounted movably along two axes intersecting each other with respect to a table base plate has been often used. In this XY table, a work placed on the movable table is moved along two axes, X and Y axes independently. In the precision printing machine or the like, not only an operation for moving a printing work placed on the movable table along the two axes, but also an operation for rotating it around an axis perpendicular to a plane formed by the two axes are required depending on the case.

Therefore, as the movable table for use in the precision printing machine or the like, an apparatus called "XYθ table" has been used, in which the movable table is not only mounted movably along the two axes intersecting each other with respect to the table base plate but also rotatably around an axis perpendicular to a plane formed by the two axes.

The technology relating to this XYθ table has been already disclosed in, for example, Unexamined Published Japanese Patent Application No.HEI8-99243, Unexamined Published Japanese Patent Application No.HEI1-240246, Unexamined Published Japanese Patent Application No.HEI1-242989, Unexamined Published Japanese Patent Application No.HEI4-210347, Unexamined Published Japanese Patent Application No.HEI8-211173, Unexamined Published Japanese Patent Application No.HEI8-252733, Unexamined Published Japanese Patent Application No.HEI9-42405, Unexamined Published Japanese Patent Application No.HEI9-155666, Unexamined Published Japanese Patent Application No.HEI9-216138, Unexamined Published Japanese Utility Model Application No.2515316, Unexamined Published Japanese Patent Application No.HEI4-354637, Unexamined Published Japanese Patent Application No.HEI6-31563, Unexamined Published Japanese Patent Application No.HEI7-219636, Unexamined Published Japanese Patent Application No.HEI5-77125, Unexamined Published Japanese Patent Application No.HEI4-2435, Unexamined Published Japanese Patent Application No.HEI3-56895, Unexamined Published Japanese Patent Application No.HEI2-202031, Unexamined Published Japanese Patent Application No.SHO62-282294 and the like.

The XYθ tables will be explained about a typical example thereof. In the longitudinally/laterally moving rotation table unit according to Unexamined Published Japanese Patent Application No.HEI8-99243, a movable table is supported on a base movably in all directions through three XY linear guide systems and a driving force is applied to moving blocks possessed by these XY linear guide systems through an independent ball screw unit. A upper rail possessed by each XY linear guide system is fixed to a bottom surface of the movable table. Upper and lower blocks possessed by the XY linear guide system are connected to each other with pins and bearing such that they are freely rotatable.

In the movable table according to Unexamined Published Japanese Utility Model No.2515316, the movable table is supported freely movably in all directions through a thrust bearing on a base. Three driving units are mounted in directions perpendicular to each other and output shafts of these driving units are connected to the movable table through a joint.

However, the above described conventional arts have the following problems. That is, in case of the longitudinally/laterally moving rotation table unit according to the Unexamined Published Japanese Patent Application No.HEI8-99243, a movable table is supported freely movably in all directions through three XY linear guide systems on the base and a driving force is applied to each of moving blocks possessed by these XY linear guide systems through an independent ball screw unit. Therefore, to rotate the movable table at a position other than an original point or move the movable table in parallel after it is rotated by a predetermined angle, the three XY linear guide systems have to be moved by different amounts mutually relating to one another, so that the table motion control becomes complicated. Also, in case of the longitudinally/laterally moving rotation table unit according to Unexamined Published Japanese Patent Application No.HEI8-99243, there is another problem, because the rotation center of the movable table is deviated due to motions thereof in the XY directions; it is difficult to carry out such a processing as printing or the like on a work placed on the movable table by rotating the movable table while moving it linearly along an axis after the movable table is positioned in the XY plane. Additionally, in case of the longitudinally/laterally moving rotation table unit according to the aforementioned Unexamined Published Japanese Patent Application No.HEI8-99243, the movable table is supported freely movably in all directions through three XY linear guide systems. Thus, further problem is that when a work is mounted or dismounted on/from the movable table, the movable table cannot be moved largely along a single axis even if it is requested.

On the other hand, in case of the movable table according to the aforementioned Unexamined Published Japanese Utility Model Application No.2515316, the movable table is supported movably in all directions through a thrust bearing on the base and three driving units intersecting each other are mounted on the base. Then, output shafts of the driving units are connected to the movable table through a joint. To rotate the movable table at a position other than an original point or move the movable table in parallel after it is rotated by a predetermined angle, the three driving units have to be moved by different amounts mutually relating to one another, so that the table motion control becomes complicated. Further, this invention has a problem that the rotation center of the movable table is deviated because of motions thereof in the XY directions and further has a problem that the movable table cannot be largely moved along an axis.

OBJECT AND SUMMARY OF THE INVENTION

Accordingly, the present invention has been made to solve the above described problems, and therefore, it is an object of the invention to provide a movable table unit capable of carrying out an operation for rotating a movable table at a position other than an original point and an operation for moving it in parallel after rotating by a predetermined angle by a simple control, capable of moving the rotation center linearly along two axes easily, and further moving the movable table largely along a single axis.

To achieve the above object, the present invention provides a movable table unit comprising: a table base plate; a movable table supported movably on the table base plate; a plurality of moving members joined to a bottom surface of the movable table; a plurality of two-axis guiding systems for guiding each of the moving members along two axes intersecting with each other on the table base plate and for guiding it largely along an axis; rotation systems for supporting the movable table or moving members rotatably relative to each of the two-axis guiding systems; and a plurality of driving means for moving each of the moving members selectively along any one of the two axial directions so as to provide the movable table with a linear motion along the two axes and for providing the movable table with a rotation motion around an axis perpendicular to the table base plate.

According to the above technological means, a plurality of the moving members are joined to a bottom surface of the movable table and each of these moving members is guided freely movably along two axes intersecting each other on the table base plate by the two-axis guiding system. Thus, by moving each of the moving members selectively along any one of the two axes by the driving means, the movable table can be moved linearly along each axis.

By combining the plural moving members to be moved by the driving means or selecting a direction of the motion thereof, a rotation moment force is applied to the movable table so as to provide the table with a rotation motion around an axis perpendicular to the table base plate.

Further, because the two-axis guiding system for guiding the moving member on the table base plate is so constructed that the moving member is guided largely along an axis, when a work to be placed on the moving table is mounted or dismounted, the movable table can be moved largely along an axis.

According to the present invention, an operation for rotating the movable table at a position other than an original point or an operation for moving the movable table in parallel after it is rotated by a predetermined angle can be carried out by a simple control, and an operation for moving the rotation center linearly along an axis can be carried out easily. Additionally, a movable table unit capable of moving the movable table largely along an axis can be provided.

According to the present invention, as the two-axis guiding system, for example, a system in which the movable member is guided movably along the X axis and Y axis which are perpendicular to each other, is used. However, the two axes guided by the two-axis guiding system are not restricted to the X-axis and Y-axis directions which are perpendicular to each other, but any two axes are permitted as long as they cross each other at a predetermined angle.

This two-axis guiding system, for example, comprises a track rail formed in a linear shape and a moving block formed to have a substantially C-shaped cross section and mounted movably to the track rail through a plurality of rolling bodies. That is, by stacking two two-axis guiding systems such that the track rails thereof intersect each other, the movable table can be guided in two directions which are perpendicular to each other. This is the same as the known XY table. Further, it is permissible to employ a linear motion guide system which comprises a wide track rail formed in channel shape and a moving block mounted movably within a channel of the track rail through a plurality of rolling bodies.

Any rotation system may be used as long as the movable table or the moving member joined thereto is supported rotatably relative to each two-axis guiding system. For example, it is permissible to provide the rotation system between the movable table and moving member or it is also permissible to incorporate the rotation system in the two-axis guiding system for guiding the moving member.

However, in case where the rotation system is provided between the movable table and moving member, a force for driving the movable table is transmitted directly through the rotation system. Therefore, the driving force can be transmitted in a substantially parallel direction to a gravity center of the movable table. When the movable table is driven, unbalanced moment load is never applied to the rolling bodies or the like incorporated in the rotation system, so that the movable table can be moved smoothly.

Any two-axis guiding system may be used as long as it is capable of receiving a load in the lateral direction. Not only other type of linear bearing using the rolling guide but also the sliding bearing can be used.

Further, the driving means is constituted of, for example, a screw feeding (ball screw or the like) mechanism and the nut portion meshing with the feeding screw shaft is provided in the two-axis guiding system or moving member. If the driving means is constituted of a screw feeding mechanism, a position in the direction of the screw shaft is determined when the screw shaft is stopped. This driving means is not restricted to the screw feeding mechanism, but for example, an actuator (e.g., made by ORIENTARU MOTOR Co.) in which a shaft reciprocates linearly can be used. Meanwhile, although the driving means is mounted on the table base plate which is a fixed side, it may be also mounted to the movable table which is a movable side.

DETAILED DESCRIPTION OF THE PREFERRED EMBODIMENTS

Hereinafter, a movable table unit of the present invention will be described in detail with reference to the accompanying drawings.

Embodiment 1

Figure 1:
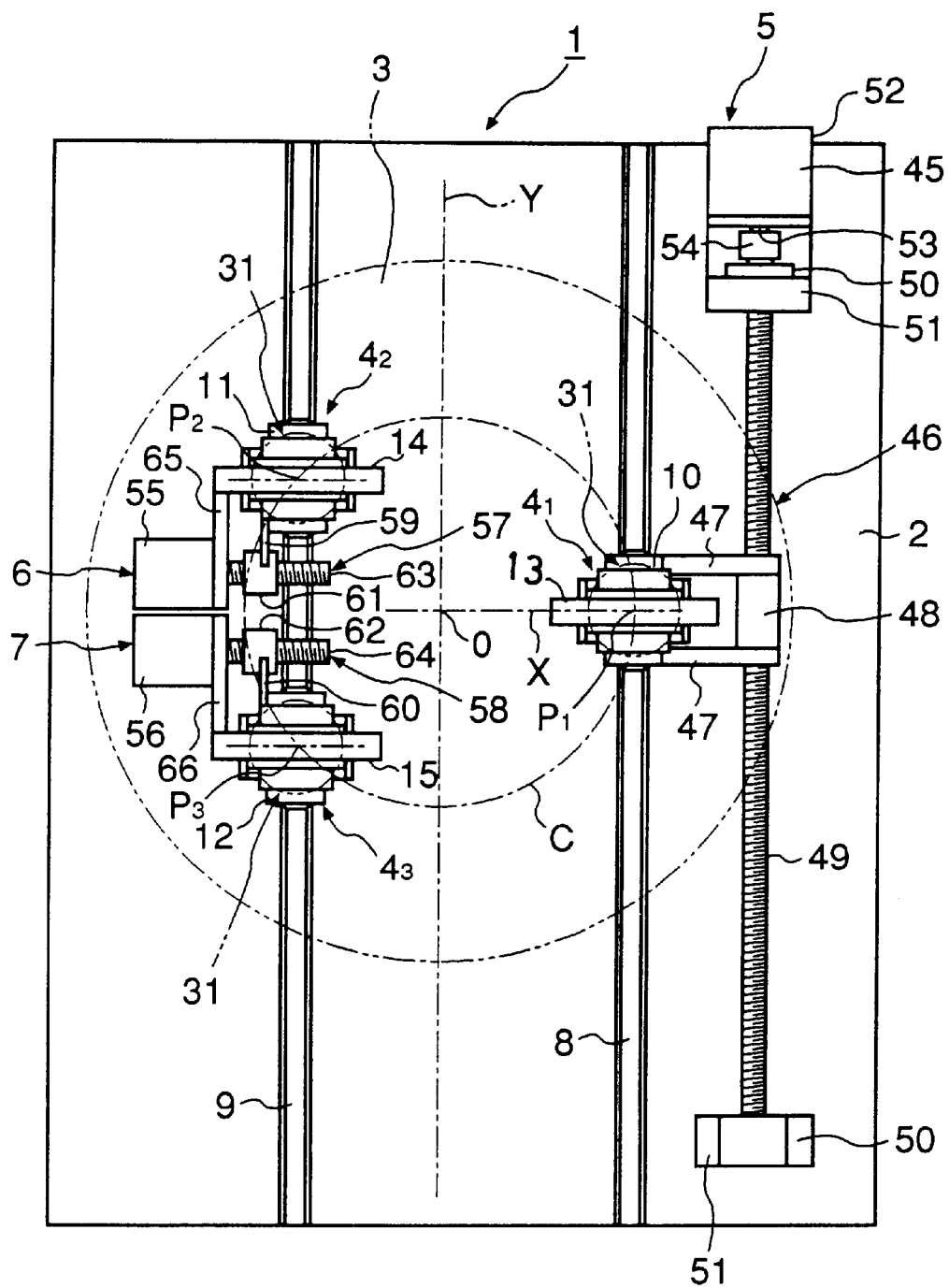
FIG. 1 is a plan view showing a first embodiment of a movable table of the present invention.
Figure 2:
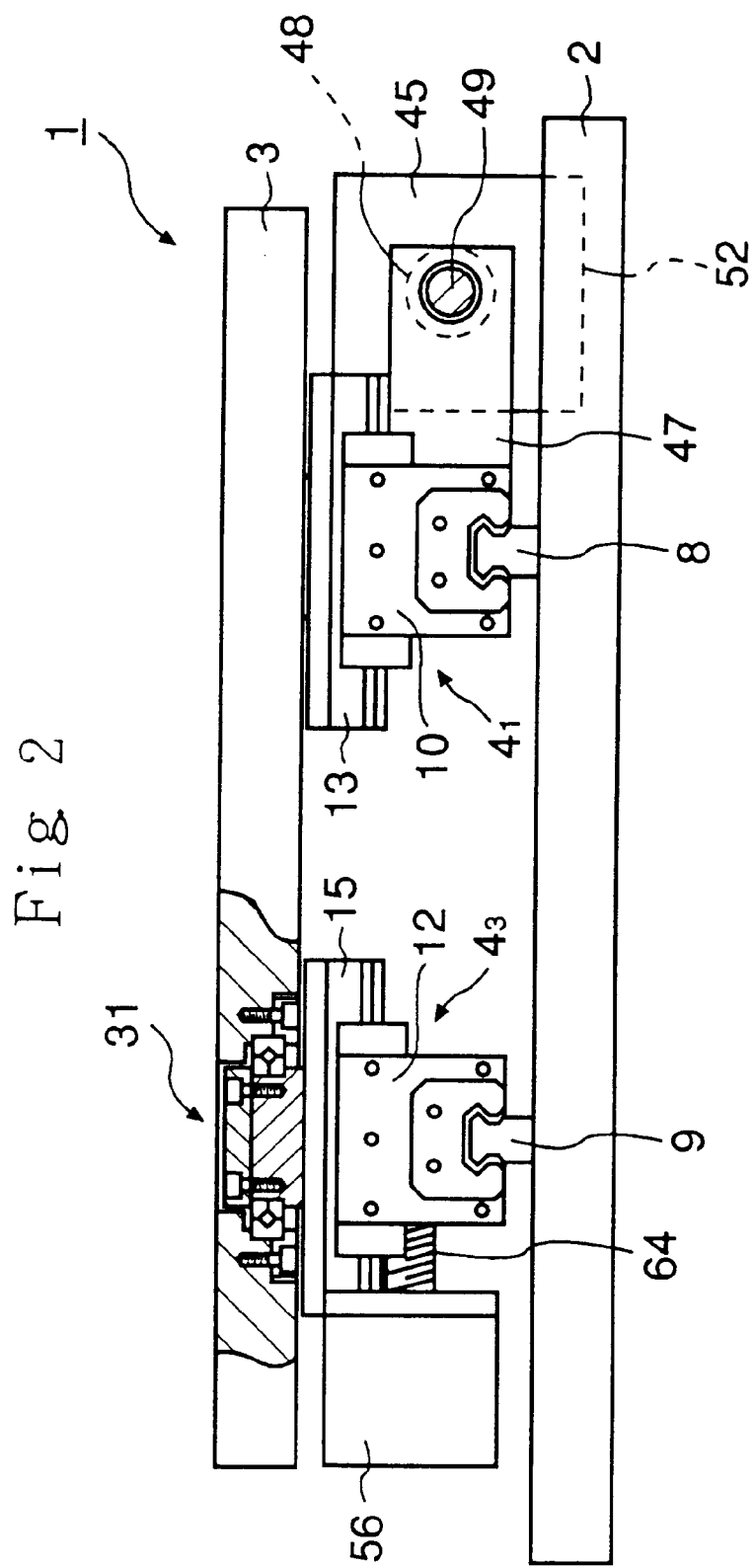
FIG. 2 is a partially broken-away side view showing the movable table unit according to the first embodiment.

FIGS. 1 and 2 are construction diagrams showing a first embodiment of the movable table unit of the present invention.

As shown in FIGS. 1 and 2, the movable table unit 1 of the first embodiment comprises a table base plate 2, a movable table 3, moving members 13, 14, 15 joined to a bottom face of this movable table, three two-axis guiding systems $4_1$, $4_2$, $4_3$ for guiding movably these moving members 13, 14, 15 along both X and Y axes perpendicular to each other and guiding them largely movably along the Y axis, a rotation system 31 for joining the aforementioned movable table 3 to the moving members 13, 14, 15 freely rotatably, a first driving means 5 for driving the moving member 13 guided by the first two-axis guiding system $4_1$ along the Y-axis, and two secondary driving means 6, 7 for driving the moving members 14, 15 guided by the second and third two-axis guiding systems $4_2$, $4_3$ independently along the X-axis.

As shown in FIGS. 1 and 2, the aforementioned table base plate 2 is formed in the shape of a flat rectangular plate and the movable table 3 is formed in the shape of a disk having a slightly smaller diameter than the width of the table base plate 2. Three two-axis guiding systems $4_1$, $4_2$, $4_3$ are disposed at each predetermined position on the table base plate 2. As shown in FIG. 1, in an initial state before the driving is started, the positions $P_1$, $P_2$, $P_3$ of rotation shafts of the first, second and third two-axis guiding systems $4_1$, $4_2$, $4_3$ for supporting the movable table 3 rotatably are disposed so as to be located on a single circle C formed around an original position 0. The first, second and third two-axis guiding systems $4_1$, $4_2$, $4_3$ are joined to the movable table 3 freely rotatably under a positional relation shown in FIG. 1. That is, the first two-axis guiding system $4_1$ is joined to the movable table 3 at the position $P_1$ intersecting the circle C on the X-axis with respect to the rotation center O of the movable table 3, and the other second and third two-axis guiding systems $4_2$, $4_3$ are joined to the movable table 3 at the positions $P_2$, $P_3$ on the circle C which are symmetrical relative to the X axis.

As shown in FIG. 1, the track rail 8 in the Y-axis direction for the first two-axis guiding system $4_1$ is installed near an end in the width direction (X-axis direction) of the table base plate 2 such that it spans an entire length of the table base plate 2 along the length direction (Y-axis direction) thereof. Of the aforementioned three two-axis guiding systems, the second and third two-axis guiding systems $4_2$, $4_3$ use the track rail 9 in the Y-axis direction commonly, and the track rail 9 in the Y-axis direction is installed near the other end in the width direction of the table base plate 2 so that it spans an entire length of the table base plate 2 along the length direction thereof and it is parallel to the track rail 8 of the first two-axis guiding system $4_1$.

The three two-axis guiding systems $4_1$, $4_2$, $4_3$ are constructed in the same way, comprising the track rails 8, 9 in the Y-axis direction with a long span installed on the table base plate 2, moving blocks 10, 11, 12 mounted to the track rails 8, 9 in the Y-axis direction freely movably through a plurality of balls as rolling bodies, and short X-axis direction track rails 13, 14, 15 mounted freely movably in a direction perpendicular to the track rails 8, 9 through a plurality of balls as rolling bodies to the moving blocks 10, 11, 12. These short track rails 13, 14, 15 are joined to the moving table as a moving member.

Figure 3:
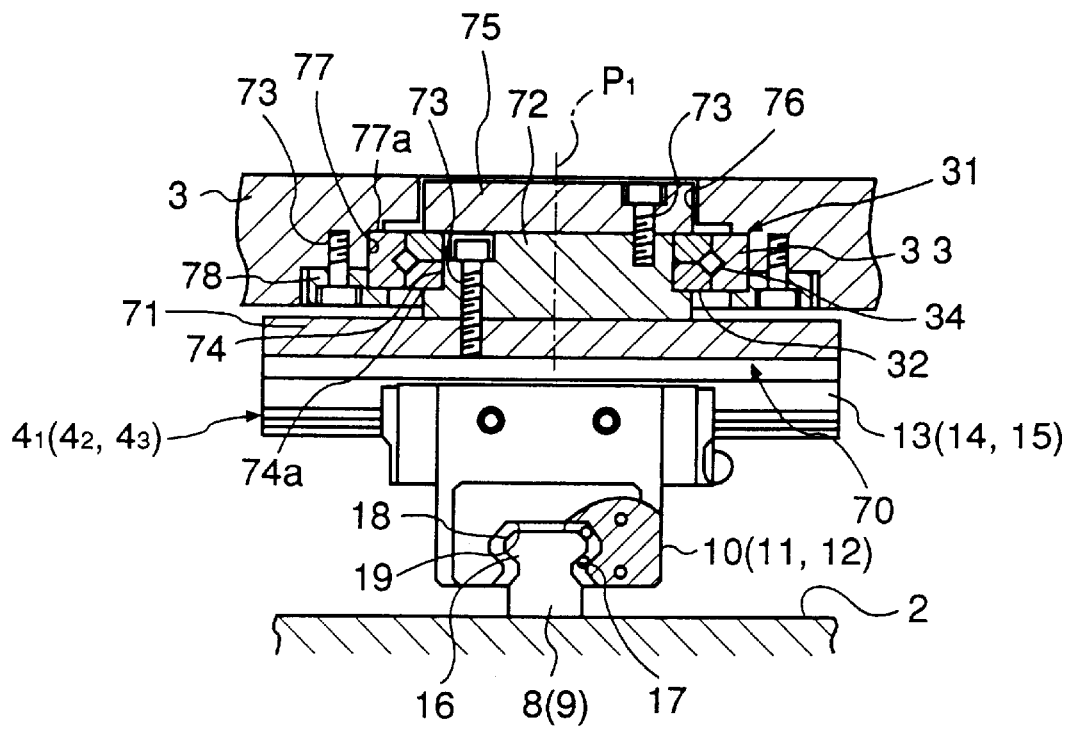
FIG. 3 is a front sectional view showing the two-axis guiding system.
Figure 4:
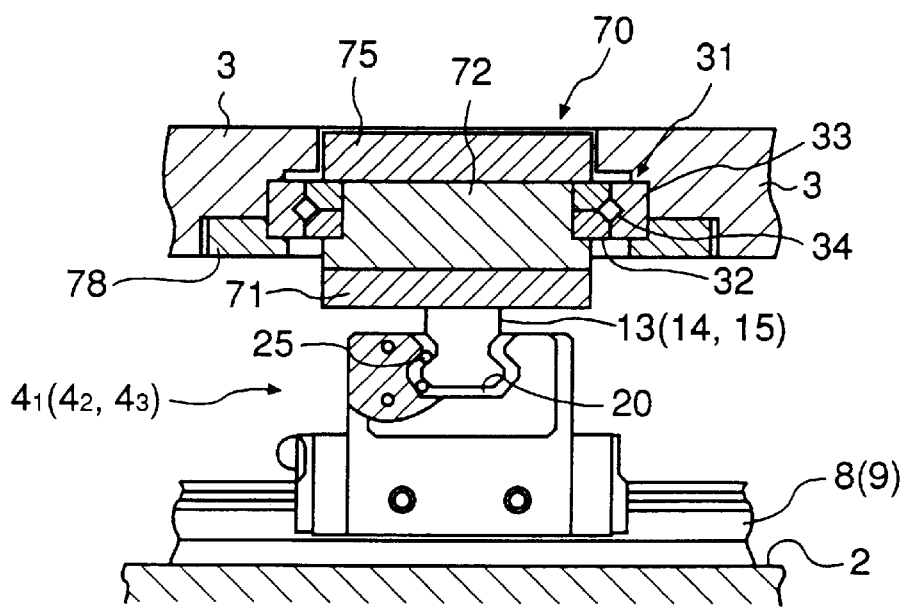
FIG. 4 is a side sectional view showing the two-axis guiding system.

Further, a structure of the two-axis guiding systems $4_1$, $4_2$, $4_3$ will be described in detail. As shown in FIGS. 3, 4, the two-axis guiding systems $4_1$, $4_2$, $4_3$ is a linear guiding system comprising the track rails 8, 9 in the Y-axis direction, the moving blocks 10, 11, 12 and the track rails 13, 14, 15 in the X-axis direction for guiding the movable table 3 freely movably along two axes (XY axes) intersecting each other and supporting the movable table 3 freely rotatably. As shown in FIG. 3, a guiding portion 16 is formed on a upper portion of the track rails 8, 9 in the Y-axis direction such that it is protruded in a trapezoidal shape to both the sides thereof. Two ball rolling grooves 18 in which a plurality of balls 17 as rolling bodies roll are formed on corner portions located up and down of the right and left guide portions 16, totaling four ball rolling grooves. As shown in FIG. 3, a first concave portion 19 having a C-shaped cross section in which each of the track rails 8, 9 in the Y-axis direction is inserted, is provided in a bottom face of the moving blocks 10, 11, 12 and as shown in FIG. 4, a second concave portion 20 having a C-shaped cross section in which each of the track rails 13, 14, 15 in the X-axis direction is inserted, is provided in a top face of the moving blocks 10, 11, 12 such that the second concave portion 20 intersects the first concave portion 19. Further, as shown in FIG. 6, four ball rolling grooves 21 are provided in right and left inner faces of the first concave portion 19 of the moving blocks 10, 11, 12 opposing the right and left side faces of the track rails 8, 9 in the Y-axis direction such that they are located at positions corresponding to the right and left ball rolling grooves of the track rails 8, 9 in the Y-axis direction.

Figure 5:
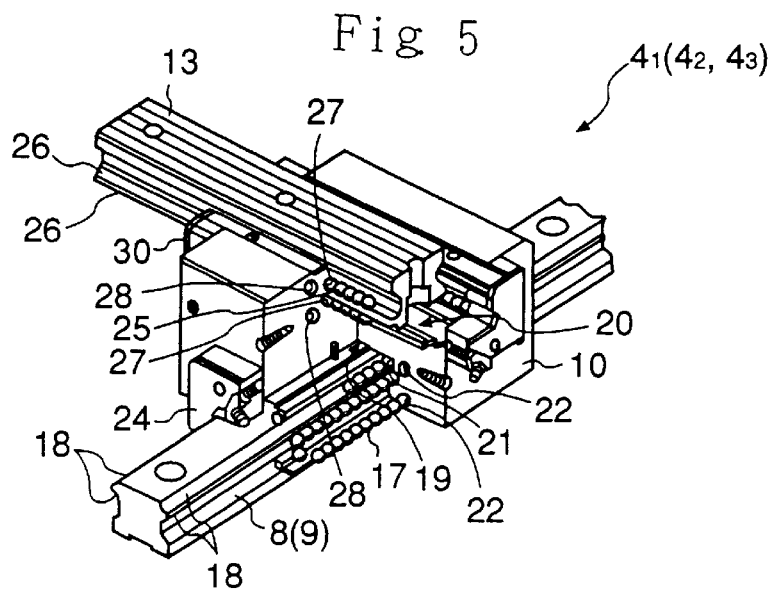
FIG. 5 is a perspective view showing the two-axis guiding system.
Figures 6, 7:
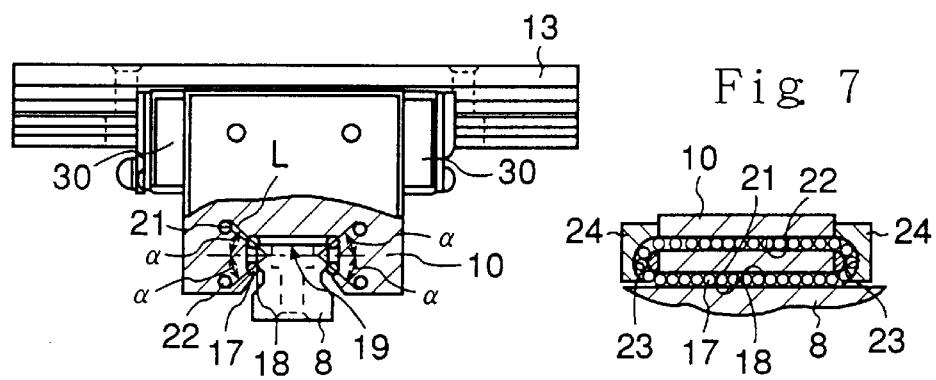
FIG. 6 is a front view showing a cross section of a first concave portion of the two-axis guiding system.
FIG. 7 is a sectional view showing arrangement of balls in the first concave portion of the two-axis guiding system.

As shown in FIGS. 5, 6, four ball escaping paths 22 are provided corresponding to the four ball rolling grooves 21 of the first concave portion 19 in the lower portion of the moving blocks 10, 11, 12 such that they are in parallel to each other. In the lower portion of the moving blocks 10, 11, 12, as shown in FIG. 7, side lids 24 containing four direction changing paths 23 for connecting the ball rolling grooves 21 of the moving blocks 10, 11, 12 with the ball escaping paths 22 on both ends are provided on both end portions in the length direction of the first concave portion 19.

The contact directions of the four rows of the balls 17 interposed between the track rails 8, 9 in the Y-axis direction and the first concave portion 19 are inclined at a predetermined angle α with respect to a horizontal line H passing through the center of the upper and lower ball rows, such that they are symmetrical thereto, as shown in FIG. 6. In this embodiment, an outward opening contact structure is applied, in which the contact angle line L connecting the center of each ball 17 and a contact point thereof with the ball rolling groove 21 is closed in an inward direction of the first concave portion 19 and opened in an outward direction which is opposite to the first rolling groove 21. Consequently, an appropriate preliminary pressure is applied to the balls 17. Of course, an inward opening contact structure which is opened in an inward direction of the first concave portion 19 may be utilized.

Figures 8, 9:
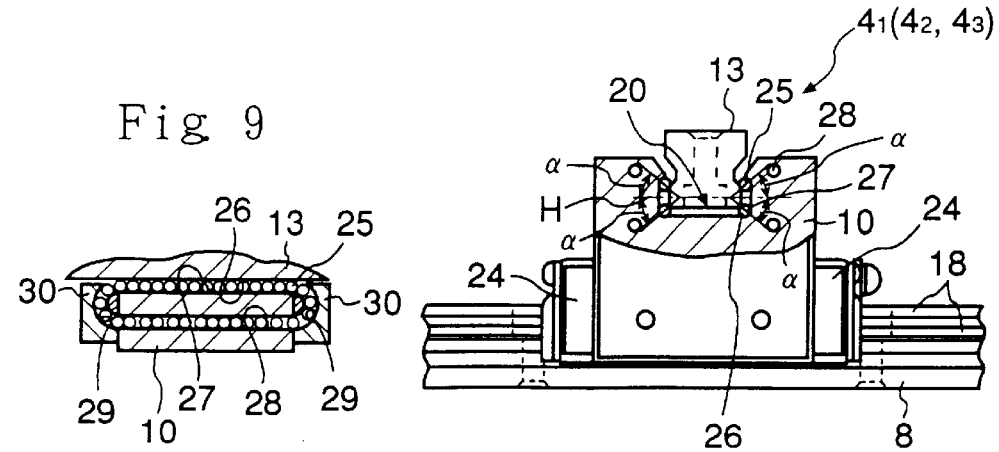
FIG. 8 is a front view showing a cross section of a second concave portion of the two-axis guiding system.
FIG. 9 is a sectional view showing arrangement of balls in the second concave portion of the two-axis guiding system.

On the other hand, as shown in FIGS. 5, 8, two ball rolling grooves 26 in which balls 25 roll are provided on each of the right and left sides of the track rails 13, 14, 15 in the X-axis direction and totally four ball rolling grooves 26 are provided. Four ball rolling grooves 27 corresponding to the ball rolling grooves 26 of the track rails 13, 14, 15 in the X-axis direction are provided on the right and left inner faces of the second concave portion 20 of the moving blocks 10, 11, 12 opposing the right and left side faces of the track rails 13, 14, 15 in the X-axis direction.

Further, in the upper end portion of the moving blocks 10, 11, 12, four ball escaping paths 28 corresponding to the four ball rolling grooves 27 of the second concave portion 20 are provided in parallel to each other. As shown in FIG. 9, side lids 30 containing four direction changing paths 29 for connecting both ends of each ball rolling grooves 27 of the moving blocks 10, 11, 12 and both ends of the ball escaping paths 28 are provided on both end portions of the second concave portion 20 of the moving blocks 10, 11, 12.

Further, as shown in FIG. 8, contact directions of four rows of the balls 25 interposed between the track rails 13, 14, 15 in the X-axis direction and the second concave portion 20 are inclined at a predetermined angle α with respect to the horizontal line H passing through the center of the ball rolling grooves 26 of the upper and lower rows, such that they are symmetrical thereto. In this embodiment, outward opening contact structure is employed, in which a contact angle line L connecting the center of the ball 25 with a contact point of the ball rolling groove 26 is closed in an inward direction of the second concave portion 20 and opened in an outward direction of the second concave portion 20. Of course, inward opening contact structure which is opened in an inward direction of the second concave portion 20 may be utilized. An appropriate preliminary pressure is applied to the balls 25.

A rotation system 31 for supporting the movable table 3 freely rotatably with respect to the track rails 13, 14, 15 in the X-axis direction of the three two-axis guiding systems $4_1$, $4_2$, $4_3$ will be described in detail.

As shown in FIGS. 3, 4, 10, 11, the rotation system 31 contains inner track ring 32 and outer track ring 33, which are formed in a circular shape. These inner and outer track rings 32, 33 are disposed concentrically such that they engage each other. In this embodiment, the track ring fixed to the track rails 13, 14, 15 in the X-axis direction is the inner track ring 32 and the track ring fixed to the movable table 3 is the outer track ring 33. A plurality of rollers 34 as rolling bodies are disposed between both the track rings 32 and 33.

As shown in FIGS. 3, 4, the aforementioned inner track ring 32 is joined to the linear track rails 13, 14, 15 in the X-axis direction through a joint member 70. This joint member 70 comprises a first joint plate 71 to which the track rails 13, 14, 15 in the X-axis direction are fixed and a disc-shaped second joint plate 72 to which the inner track ring 32 is fixed, and the first joint plate 71 and the second joint plate 72 are fixed to each other with a bolt 73. A step concave portion 74 is provided on an outer periphery of the second joint plate 72 and the inner track ring 32 is mounted on this step concave portion 74 from upward. A pressing member 75 is fixed to a top end face of the step concave portion 74 by screwing a bolt, so that the inner track ring 32 is fixed in a condition in which it is nipped from up and down between the pressing member 75 and a step portion 74a located at the root of the step concave portion 74.

On the other hand, the movable table 3 to which the outer track rail 33 is to be fixed includes a circular opening portion 76, in which the pressing member 75 of the inner track ring 32 can be inserted from up and a circular step concave portion 77 is provided on a lower edge of the internal periphery of the opening portion 76. The outer track ring 33 is mounted on this step concave portion 77. Further, a pressing member 78 for pressing the outer track ring 33 is fixed to an opening edge of the step concave portion 77 by tightening a bolt 73, so that the outer track ring 33 is held between this pressing member 78 and the step portion 77a of the step concave portion 77 in a condition in which it is nipped from up and down.

Figure 11:
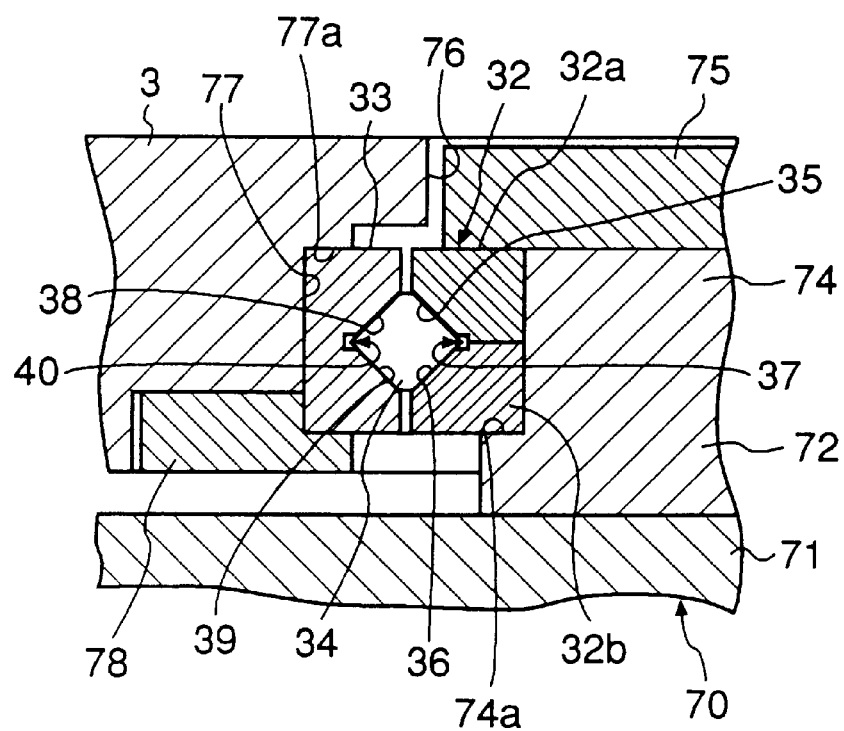
FIG. 11 is a sectional view of major portions showing a mounting condition of the rotation system.

As shown in FIG. 11, a first track groove 37 constituted of upper and lower roller rolling surfaces 35, 36 which are opened outward in the radius direction at a substantially 90° is formed on an outer peripheral face of the inner track ring 32. On the other hand, a second track groove 40 constituted of two upper and lower roller rolling surfaces 38, 39 which are opened inward in the radius direction at an angle of substantially 90° opposing the first track groove 37 is formed on an inner peripheral face of the outer track ring 33.

Figure 10:
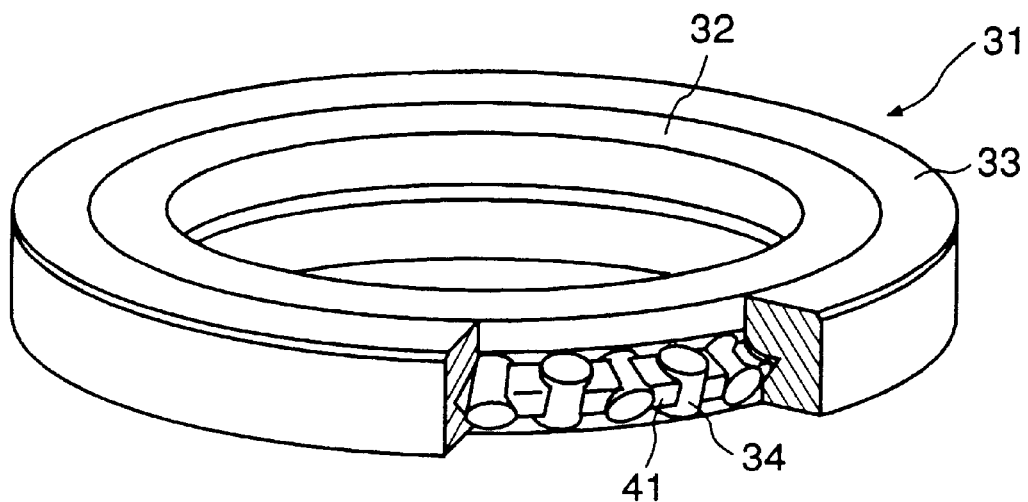
FIG. 10 is a partially broken-away perspective view showing a rotation system.

As shown in FIG. 10, a part of the rollers 34 interposed between the first track groove 37 and the second track groove 40 are interposed between a upper roller rolling face 35 of the first track groove 37 and a lower roller rolling face 36 of the second track groove 40 such that they are freely rotatable. The remaining rollers 34 are interposed between a lower roller rolling face 36 of the first track groove 37 and a upper roller rolling face 38 of the second track groove 40 such that they are freely rotatable.

The rollers 34 interposed between the upper roller rolling surface 35 of the first track groove 37 and the lower roller rolling surface 39 of the second track groove 40 such that they are freely rotatable, and the rollers 34 interposed between the lower roller rolling face 36 of the first track groove 37 and the upper roller rolling face 38 of the second track groove 40 such that they are freely rotatable, are so constructed in so-called "cross rotor type", in which both of the rollers 34 are arranged such that they intersect each other alternately. As shown in FIG. 10, a spacer retainer 41 is interposed between the rollers 34.

As for the arrangement of the rollers 34, the rollers 34 may be arranged not such that their rotating axes intersect each other alternately, but such that their rotating axes change their directions every two or three rollers. The rollers 34 may be arranged in various ways. A plurality of the rollers 34 interposed between the inner track ring 32 and outer track ring 33 are supplied with a preliminary pressure. As for application of the preliminary pressure, according to this embodiment, as shown in FIG. 11, the inner track ring 32 is divided to the upper and lower portions 32a, 32b, and a gap is formed between the upper and lower portions 32a and 32b of the inner track ring 32 in a condition that the upper and lower roller rolling faces 35, 36 are in a free contact with the roller 34, and then the upper and lower portions 32a, 32b are tightened vertically until the gap therebetween is eliminated, thereby compressing each roller 34 by a predetermined amount to apply the preliminary pressure thereto.

As other structure for applying the preliminary pressure to the rollers 34, it is permissible to provide a circumference of the outer track ring 33 with a slit (not shown), so that when the outer track ring 33 is mounted on the step concave portion 42 of the movable table 3, the slit in the outer track ring 33 is narrowed to reduce the diameter thereof, thereby pressing the rollers 34 from the right and left sides to apply the preliminary pressure.

By constructing the rotation system 31 with a structure in which the rollers 34 are interposed between the inner track ring 32 and outer track ring 33, it is possible to obtain a supporting structure having a high stiffness against a load from every direction including a load for compressing in the rotation axis direction, a load for pulling in the rotation axis direction, a load to be applied in a direction perpendicular to the rotation axis, a moment load for inclining the rotation axis and the like. Therefore, a light, highly stiff supporting structure can be obtained.

The movable table unit 1 according to the first embodiment, as shown in FIG. 1, comprises a first driving means 5 for driving the moving block 10 of the first two-axis guiding system $4_1$ along the Y axis having a large moving amount, and the second driving means 6, 7 for driving the track rails 14, 15 of the second and third two-axis guiding systems $4_2$, $4_3$ independently along the X axis.

As shown in FIGS. 1, 2, the first driving means 5 comprises a driving motor 45 such as a servo motor, stepping motor or the like and a feeding screw mechanism 46 for converting a rotating motion of the driving motor 45 to a linear motion. The aforementioned feeding screw mechanism 46 comprises a nut 48 joined to the moving block 10 of the first two-axis guiding system $4_1$ through two brackets 47, a long screw shaft 49 meshing with this nut 48, double row angular contact type bearing 50 for supporting each end of this screw shaft 49 freely rotatably and a bearing support 51 for supporting this bearing 50. The aforementioned driving motor 45 is fixed to an end portion in the length direction of the table base plate 2 through a bracket 52 and a motor shaft 53 is joined to a shaft end of the screw shaft 49 through a joint member 54. The long screw shaft 49 of the feeding screw mechanism 46 is disposed in parallel near an end in the width direction of the table base plate 2 and along the track rail 8 in the Y-axis direction of the first two-axis guiding system $4_1$.

The second driving means 6, 7 are constructed in the same way, and as shown in FIGS. 1, 2, comprise a driving motor 55, 56 such as a servo motor, stepping motor and the like, and a feeding screw mechanism 57, 58 for converting a rotating motion of the driving motor 55, 56 to linear motion. The aforementioned feeding screw mechanisms 57, 58 each comprise a nut 61, 62 joined to the moving block 11, 12 of the second, third two-axis guiding system $4_2$, $4_3$ through a bracket 59, 60 and a short screw shaft 63, 64 which meshes with the nut 61, 62. The driving motors 55, 56 are fixed to the track rails 14, 15 in the X-axis direction of the second, third two-axis guiding system $4_2$, $4_3$ through brackets 65, 66 and the short screw shafts 63, 64 are directly connected to a motor shaft (not shown). In the aforementioned two second driving means 6, 7, the driving motors 55, 56, screw shafts 63, 64 and the like are disposed symmetrically relative to the X axis in FIG. 1.

In the movable table unit according to the first embodiment having the above described structure, turning the movable table at a position other than the original point, moving the movable table in parallel after turning it at a predetermined angle and the like can be carried out by a simple control, and further moving the rotation center linearly along the two axes can be carried out easily, and additionally moving the movable table largely along an axis can be carried out.

Figure 12:
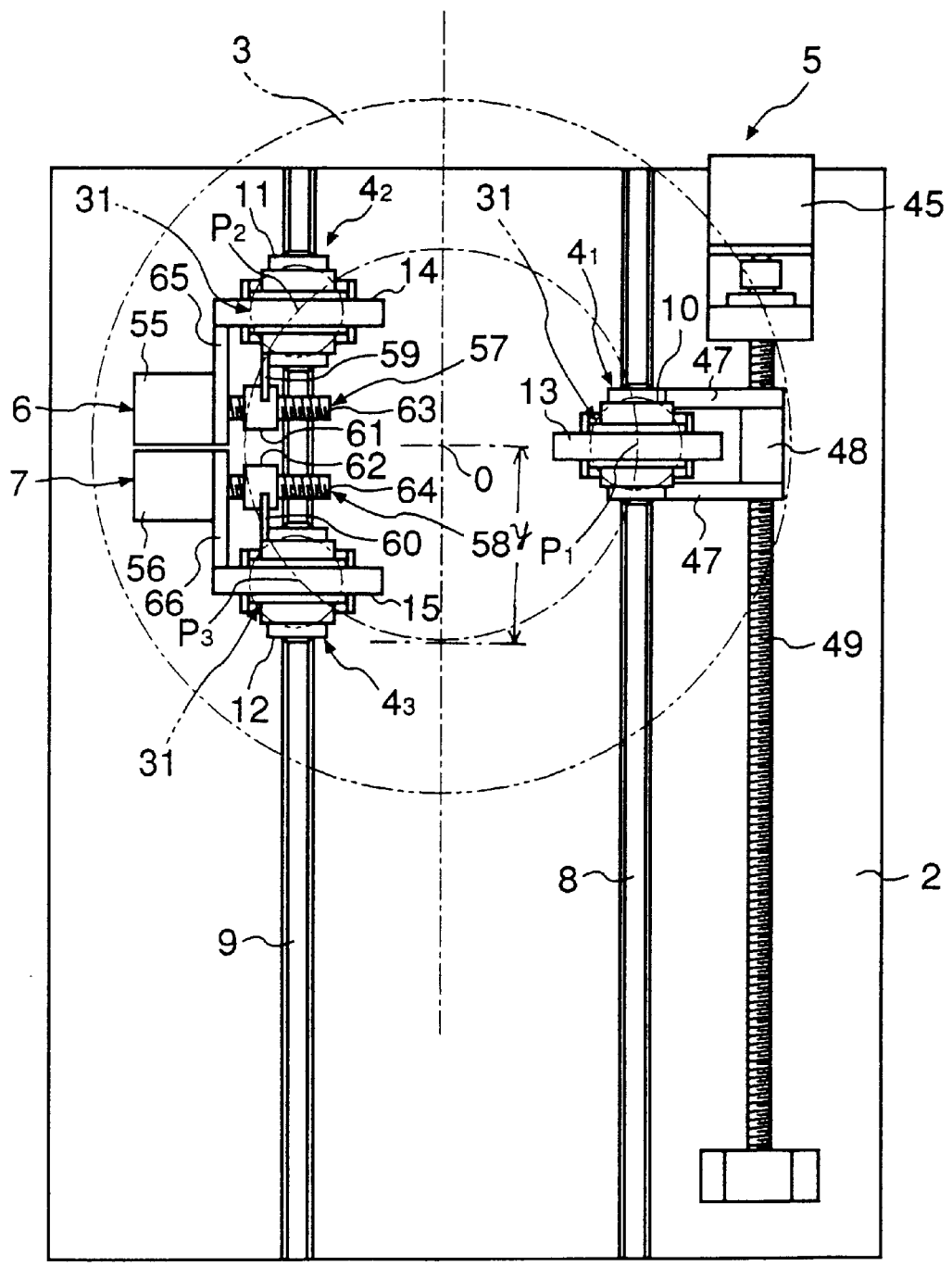
FIG. 12 is a plan view showing a case in which the movable table according to the first embodiment has been moved in the Y-axis direction.

That is, in the movable table unit 1 according to the first embodiment, the movable table 3 is stopped at a position shown in FIG. 1 in an initial state before the movable table 3 is moved. For example, in case where the movable table 3 is moved in parallel to the Y axis from this state without changing the posture of the movable table 3, the driving motor 45 of the first driving means 5 for driving the moving block 10 of the first two-axis guiding system $4_1$ along the Y axis is driven in a predetermined direction so as to rotate the long screw shaft 49 joined to the motor shaft 53 of the driving motor 45. Then, because the nut 48 meshing with the screw shaft 49 is fed in the Y-axis direction with a rotation of the screw shaft 49, the moving block 10 of the first two-axis guiding system $4_1$ fixed to the nut 48 meshing with the screw shaft 49 through a bracket 47 is also moved along the Y axis as shown in FIG. 12. Consequently, the movable table 3 joined to the moving block 10 of the first two-axis guiding system $4_1$ is moved at a predetermined distance y along the Y axis together with the track rail 13 of the first two-axis guiding system $4_1$.

Figure 13:
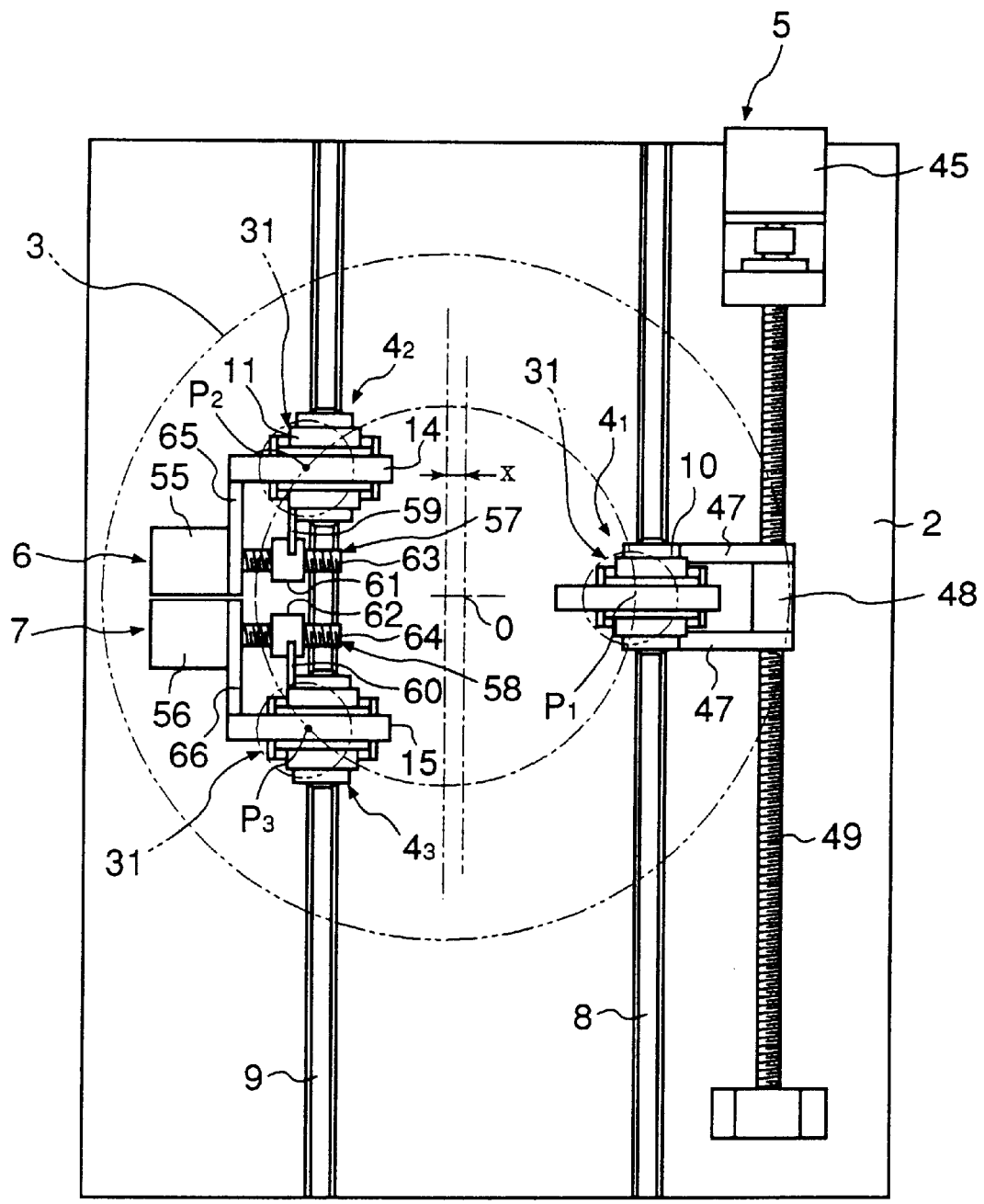
FIG. 13 is a plan view showing a case in which the movable table according to the first embodiment has been moved in the X-axis direction.

In case where the movable table 3 is moved in parallel to the X axis, the driving motors 55, 56 of the second driving means 6, 7 for driving the track rails 14, 15 in the X-axis direction of the second, third two-axis guiding systems $4_2$, $4_3$ are driven in the same rotation direction so as to rotate the screw shafts 63, 64 joined to motor shafts (not shown) of the driving motors 55, 56 in the same direction. Then, because the nuts 61, 62 meshing with the screw shafts 63, 64 are joined to the moving blocks 11, 12 of the second and third two-axis guiding systems $4_2$, $4_3$ which do not move along the X axis, through the brackets 59, 60, the screw shafts 63, 64 meshing with the nuts 61, 62 are moved in the same direction along the X axis with rotations thereof as shown in FIG. 13. Thus, the driving motors 55, 56 joined to the screw shafts 63, 64 are moved in the same direction along the X axis (for example, leftward direction of FIG. 13) with the screw shafts 63, 64. As a result, the movable table 3 joined to the track rails 14, 15 in the X-axis direction freely rotatably through the rotation system 31 is moved by a predetermined amount along the X axis, together with the track rails 14, 15 in the X-axis direction of the second, third two-axis guiding systems $4_2$, $4_3$ joined to the driving motors 55, 56 through the brackets 65, 66.

Figure 14:
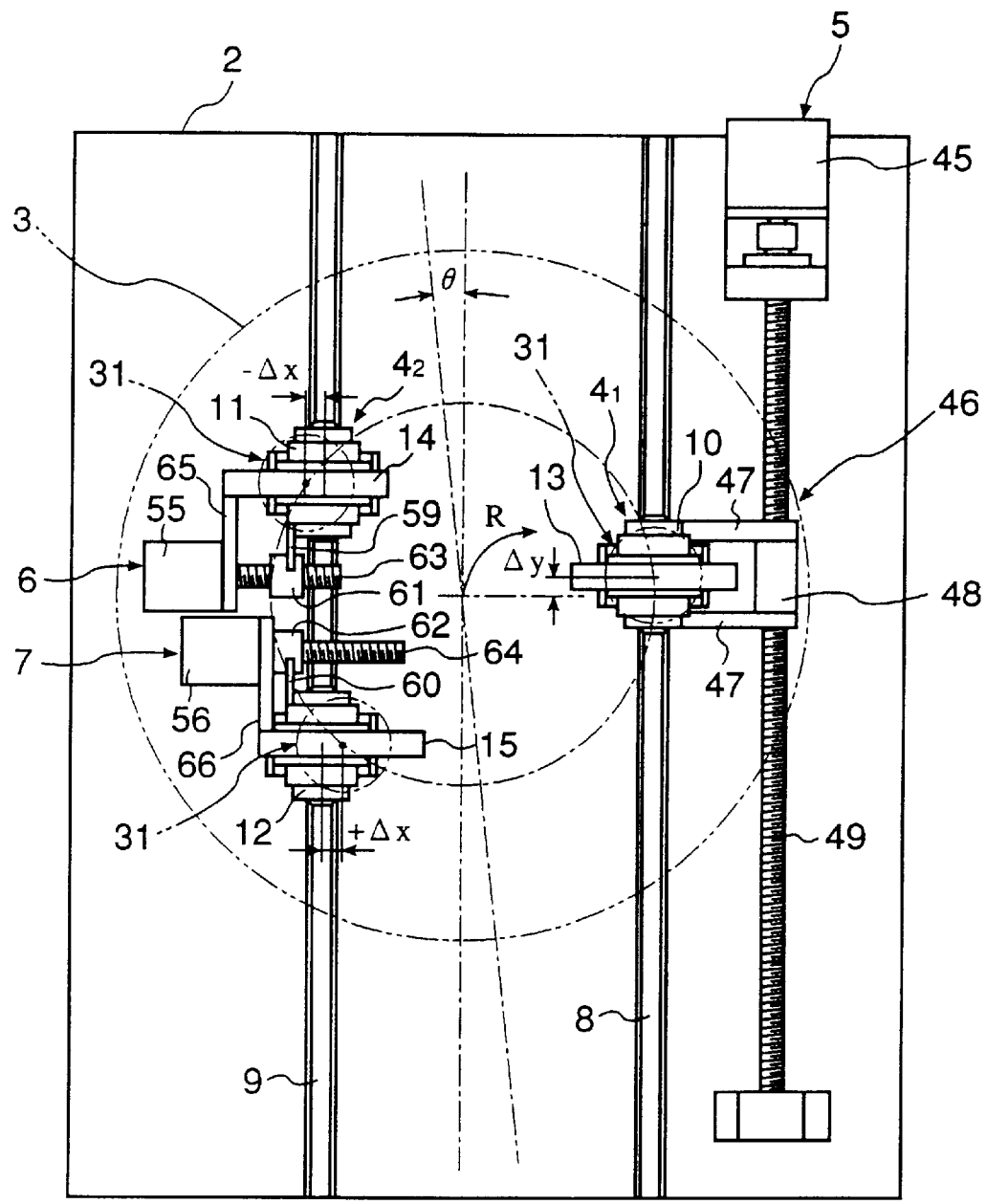
FIG. 14 is a plan view showing a case in which the movable table according to the first embodiment has been rotated.

In case where the movable table 3 is turned with respect to a rotating axis 0 perpendicular to a plane formed by the X and Y axes, the driving motors 55, 56 of the second driving means 6, 7 for driving the track rails 14, 15 in the X-axis direction of the second, third two-axis guiding systems $4_2$, $4_3$ are driven in opposite directions to each other, so as to rotate the screw shafts 63, 64 connected to motor shafts (not shown) of the driving motors 55, 56 in opposite directions to each other. If the movable table 3 is rotated in a counterclockwise direction, as shown in FIG. 14, the track rail 14 in the X-axis direction of the second two-axis guiding system $4_2$ is moved leftward in the Figure, while the track rail 15 in the X-axis direction of the third two-axis guiding system $4_3$ is moved rightward in the same Figure. On the other hand, in case where the movable table 3 is turned in a clockwise direction, the track rail 14 in the X-axis direction of the second two-axis guiding system $4_2$ is moved rightward in FIG. 14, while the track rail 15 in the X-axis direction of the third two-axis guiding system $4_3$ is moved leftward in the same Figure. In case where the movable table 3 is turned in a counterclockwise direction, the moving block 10 of the first two-axis guiding system $4_1$ is moved upward as viewed in FIG. 14 by a predetermined amount, while the movable table 3 is turned in a clockwise direction, the moving block 10 of the first two-axis guiding system $4_1$ is moved downward as viewed in FIG. 14 by a predetermined amount.

Because the nuts 61, 62 meshing with the screw shafts 63, 64 of the second driving means 6, 7 are joined to the moving blocks 11, 12 of the second, third two-axis guiding systems $4_2$, $4_3$ which are not moved in the X-axis direction through the brackets 59, 60, the screw shafts 63, 64 meshing with the nuts 61, 62 are moved in opposite directions to each other along the X axis with rotations thereof. Therefore, the driving motors 55, 56 joined to the screw shafts 63, 64 are moved by the same amount in opposite directions to each other along the X axis as shown in FIG. 14. Consequently, the track rails 14, 15 in the X-axis direction of the second, third two-axis guiding systems $4_2$, $4_3$ joined to the driving motors 55, 56 through the brackets 65, 66 are also moved in opposite directions to each other along the X axis by the same amounts $-\Delta x$, $+\Delta x$.

The screw shaft 49 is driven by the driving motor 45 of the first driving means 5 so that the nut 48 meshing with the screw shaft 49 is moved by a predetermined amount in the Y-axis direction with a rotation of the screw shaft 49. Therefore, the moving block 10 of the first two-axis guiding system $4_1$ fixed to the nut 48 meshing with the screw shaft 49 through the bracket 47 is moved by a predetermined amount $+\Delta y$ along the Y axis.

Figure 15:
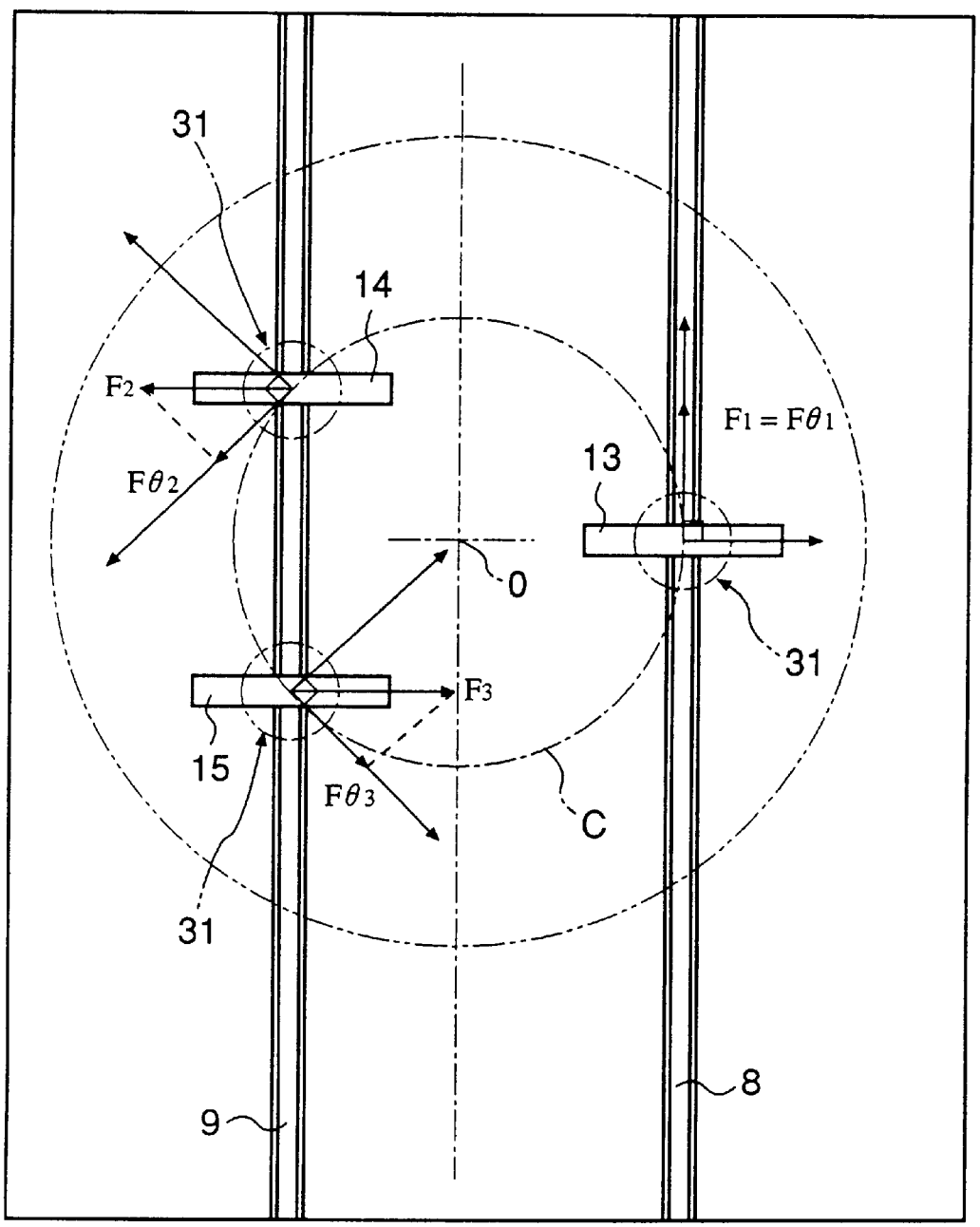
FIG. 15 is an explanatory view showing forces to be applied to the movable table according to the first embodiment.

As described above, according to the first and second driving means 5, 6, 7, the moving block 10 of the first two-axis guiding system $4_1$ is moved by a predetermined amount $+\Delta y$ along the Y axis and at the same time, the track rails 14, 15 in the X-axis direction of the second, third two-axis guiding systems $4_2$, $4_3$ are moved in opposite directions to each other by the same amounts $-\Delta x$, $+\Delta x$ along the X axis. Then, in the movable table 3 guided by the first-third two-axis guiding systems $4_1$, $4_2$, $4_3$ freely movably along the two axes, X axis and Y axis and supported freely rotatably, as shown in FIGS. 14, 15, a point $P_2$ supported by the second two-axis guiding system $4_2$ is moved leftward in FIG. 14 by the second driving means 6, a point $P_3$ supported by the third two-axis guiding system $4_3$ is moved rightward by the second driving means 7 and a point $P_1$ supported by the first two-axis guiding system $4_1$ is moved upward with respect to FIG. 14 by the first driving means 5. As a result, forces $F_1$, $F_2$, $F_3$ are applied to the points $P_1$, $P_2$, $P_3$ supported rotatably of the movable table 3 by the first and second driving means 5, 6, 7, as shown in FIG. 15. Components of force $F\theta_1$, $F\theta_2$, $F\theta_3$ in the circumferential direction of the forces $F_1$, $F_2$, $F_3$ serve for rotation moments for rotating the movable table 3 so that the movable table 3 is rotated in the counterclockwise direction of FIG. 15.

Figure 16:
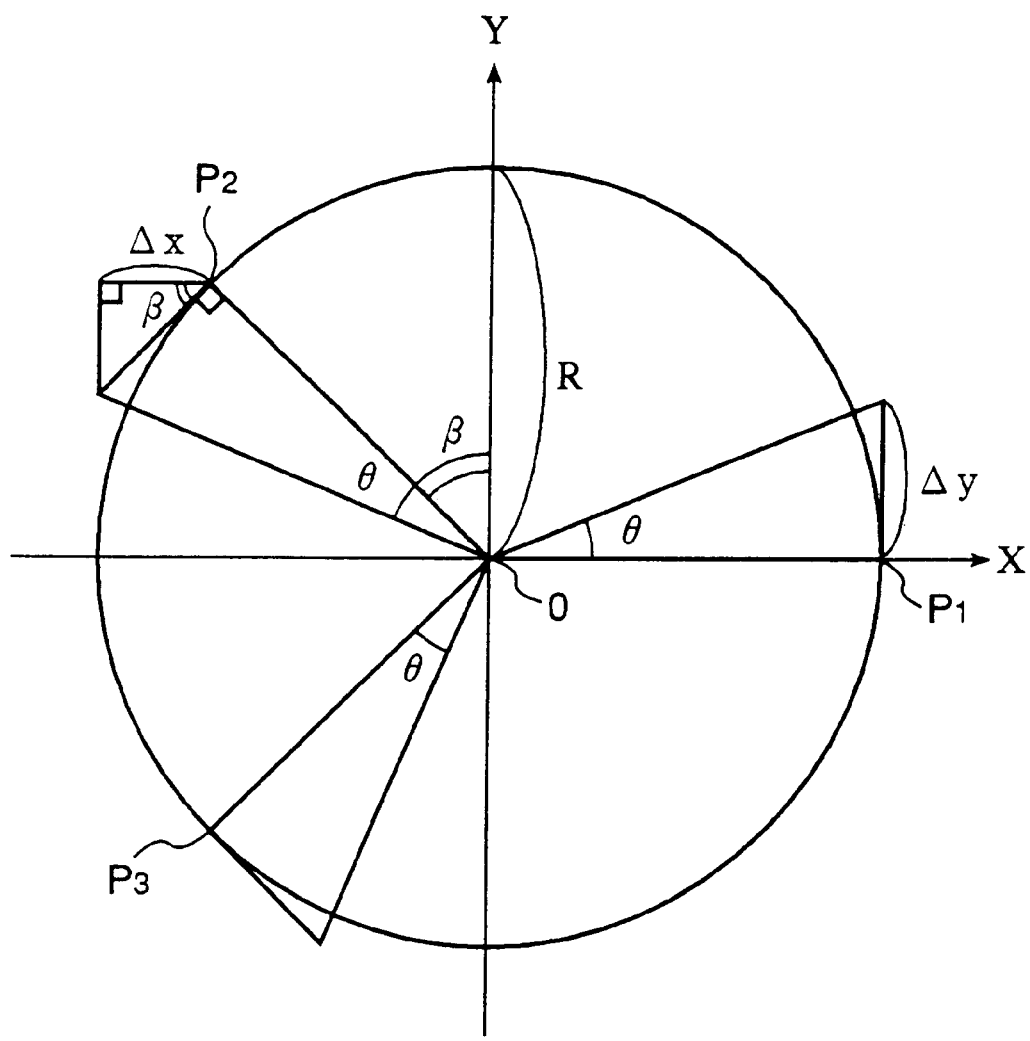
FIG. 16 is an explanatory view showing a rotation angle of the movable table according to the first embodiment of the present invention.

To rotate the movable table 3 at an angle $\theta$, as shown in FIG. 16, the track rail 13 of the first two-axis guiding system $4_1$ is moved by a predetermined amount $+\Delta y = R\tan\theta$ along the Y axis by the first driving means 57 and the track rails 14, 15 in the X-axis direction of the second and third two-axis guiding systems $4_2$, $4_3$ are moved by the same amounts $-\Delta x = -R\tan\theta\cdot\cos\beta$, $+\Delta x = +R\tan\theta\cdot\cos\beta$ respectively, in opposite directions to each other along the X axis. Where R is a radius from the rotation center O of the movable table 3 to the points $P_1$, $P_2$, $P_3$ for supporting the movable table 3 freely rotatably and $\beta$ is an angle formed by a line connecting the rotation axis O with the point $P_2$ before the movable table 3 is rotated, with respect to the Y axis.

Further, the movable table 3 may be rotated not only around the rotation axis O but also around an arbitrary rotation axis at a desired rotation radius as shown by an arrow R in FIG. 14. That is, to rotate the movable table 3 around an arbitrary rotation axis at a desired rotation radius, the first two-axis guiding system $4_1$ is moved by a predetermined amount $\Delta y$ along the Y axis by the first driving means 5, and simultaneously the second and third two-axis guiding systems $4_2$, $4_3$ are moved by different predetermined amounts $+\Delta x$, $-\Delta x'$ respectively, in opposite directions along the X axis by the second driving means 6, 7. Consequently, the movable table 3 is rotated at a rotation radius determined depending on the moving amounts $+\Delta x$, $-\Delta x'$, $\Delta y$ of the first-third two-axis guiding systems $4_1$, $4_2$, $4_3$ around a desired rotation axis. Because the moving amounts $+\Delta x$, $-\Delta x'$, $\Delta y$ of the first-third two-axis guiding systems $4_1$, $4_2$, $4_3$ are determined geometrically, if a relational expression is memorized in a control unit preliminarily, the amounts $+\Delta x$, $-\Delta\Delta x'$, $\Delta y$ and rotation amounts of the respective rotation motors are calculated by specifying a rotation center and rotation angle, so as to control the first and second driving means 5, 6, 7. A change of positions in which the two-axis guiding systems $4_1$, $4_2$, $4_3$ supports the movable table 3 freely rotatably, accompanied by a motion of the first-third two-axis guiding systems $4_1$, $4_2$, $4_3$ is absorbed by free motions of the track rail 13 in the X-axis direction and the moving blocks 11, 12 of the two-axis guiding systems $4_1$, $4_2$, $4_3$.

In the movable table unit 1, if the movable table 3 is moved in an arbitrary direction on the XY plane and simultaneously rotated in the direction $\theta$ around the rotation axis O, a motion for moving the movable table 3 in the X-axis direction, a motion for moving the movable table 3 in the Y-axis direction and a motion for rotation the movable table 3 along the direction $\theta$ are combined in an arbitrary way. However, by carrying out these three motions independently of each other, the control for moving the movable table 3 to a predetermined position and at a predetermined angle can be carried out more easily.

That is, in case where in the movable table unit 1, the movable table 3 is moved in an arbitrary direction on the XY plane and further rotated in the direction $\theta$ around the rotation axis O, the movable table 3 is moved at a desired amount along the Y axis by driving the first driving means 5, and then by driving the second driving means 5, 6 in the same direction, the movable table 3 is moved at a desired amount along the X axis. After that, by driving the second driving means 5, 6 in opposite directions to each other and simultaneously driving the first driving means 5, the movable table 3 is rotated at a desired angle in the direction $\theta$ around the rotation axis O. That is, the motion controls in the X axis, Y axis and direction $\theta$ can be carried out independently of each other, so that the motion control of themovable table 3 can be further facilitated.

As described above, in the movable table unit 1 of the first embodiment, an operation for rotating the movable table 3 at a position other than the original point or an operation for rotating it at a predetermined angle and then moving it in parallel can be carried out by a simple control. In the movable table unit 1, by driving only the first driving means 5, the movable table 3 can be moved linearly in the Y axis easily and further by driving only the second driving means 6 in the same direction, the movable table 3 can be moved linearly in the X-axis direction. Further, because the track rail 8 in the Y-axis direction of the first two-axis guiding system $4_1$ to be driven by the first driving means 5 is formed in a long length, the movable table can be moved largely along an axis.

Even if yawing occurs in the movable table unit 1 according to the first embodiment when the movable table 3 is moved along the Y axis by the first driving means 5, by driving the second driving means 6, 7 which are driving means for the X axis and direction θ, the yawing can be corrected so as to be able to move the movable table 3 to a predetermined position always with an appropriate posture.

Although in the movable table unit 1 according to the first embodiment, a case in which the movable table 3 is formed in a circular shape has been described, the movable table 3 may be so constructed that a center portion thereof is bored in a circular shape, because the three two-axis guiding systems are disposed on a circle around a rotation axis, thereby realizing a pass-through work and reduction of weight.

Although, in the first embodiment, the feeding screw mounted to the table base plate and the nut portions mounted to the moving block of the first two-axis guiding system are used as driving means, it is permissible to fix the feeding screw on the moving table and fix the nut portions on the moving block of the first two-axis guiding system.

Although in the first embodiment, a case in which the first and second driving means are provided independently for the first-third two-axis guiding systems has been described, the present invention is not restricted to this example, but it is permissible to provide the moving blocks or the like of the first and second driving means with the nut portions integrally and dispose the feeding screw inside the moving blocks or the like integrally. In this case, because the first and second driving means can be integrated with the first-third two-axis guiding systems, the size of this unit can be further reduced.

Second Embodiment

Figure 17:
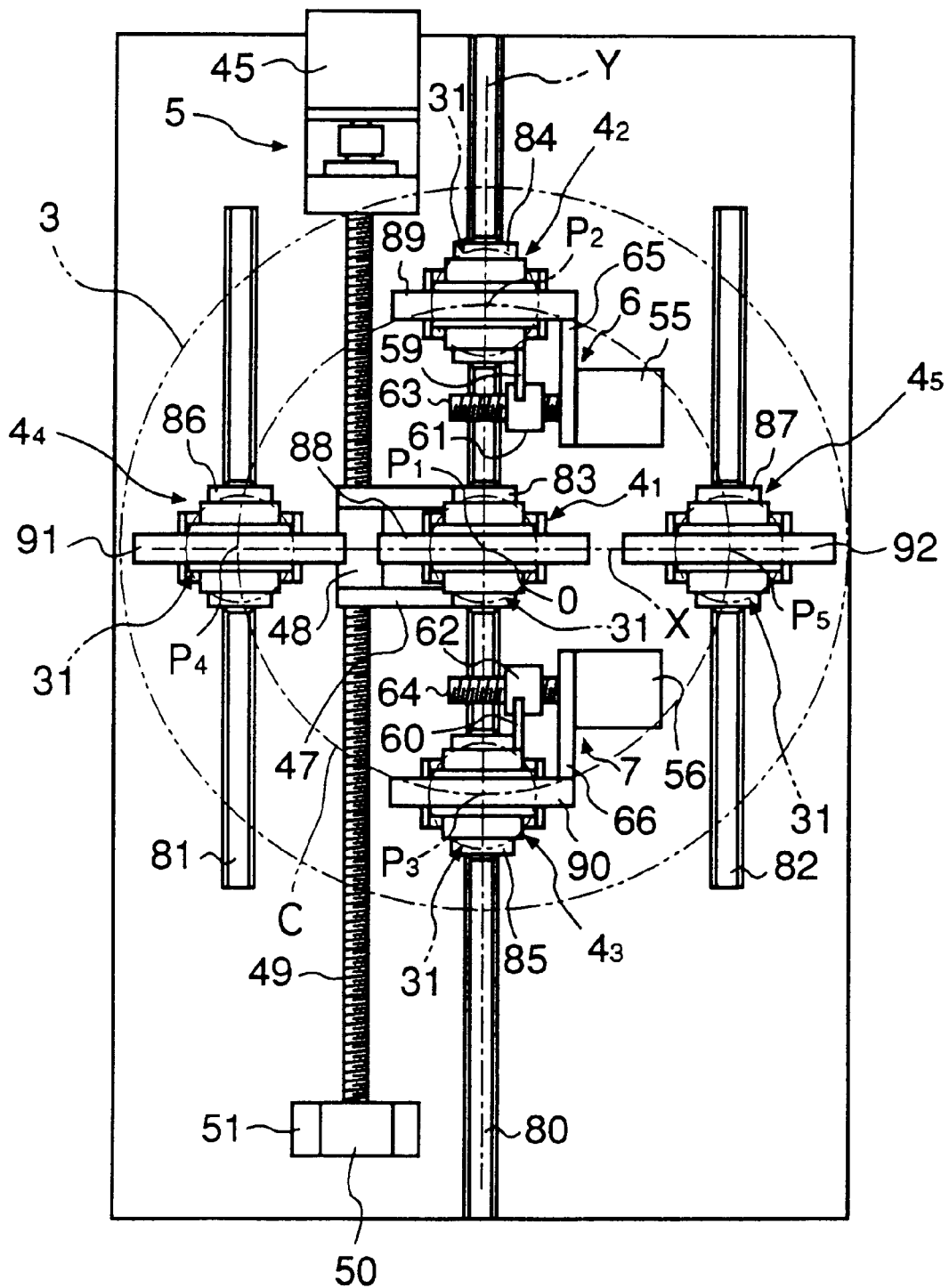
FIG. 17 is a plan view showing a second embodiment of the movable table of the present invention.
Figure 18:
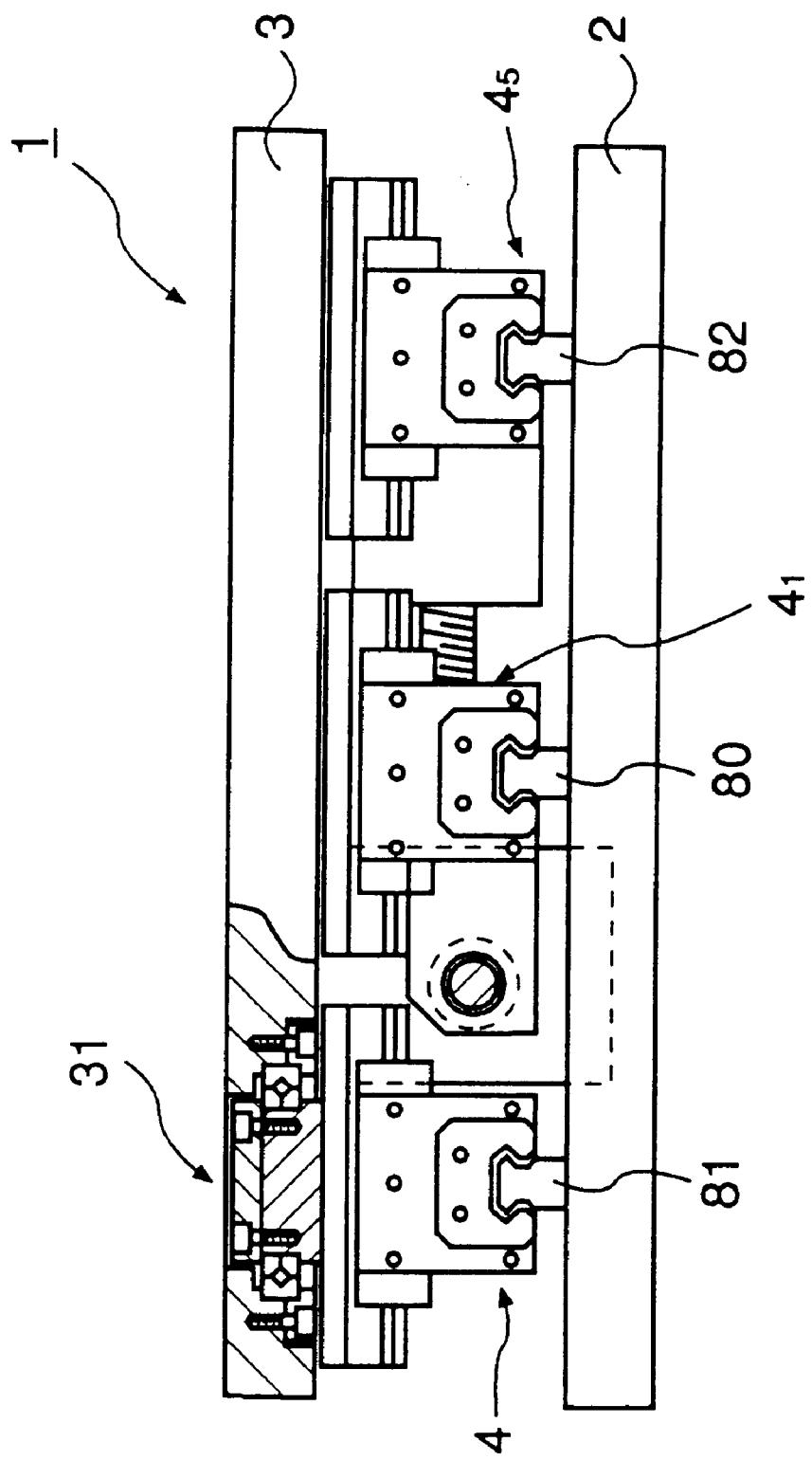
FIG. 18 is a partially broken-away side view showing the movable table according to the second embodiment.

FIGS. 17, 18 show a second embodiment of the present invention and the same reference numerals are attached to the same components as the first embodiment. According to the second embodiment, five two-axis guiding systems are provided. A two-axis guiding system provided with the first driving means is disposed in the center of rotation of the moving table and two two-axis guiding systems provided with the second driving means are disposed concentrically with the rotation center of the moving table and on a diameter along the Y axis.

That is, in the movable table unit 1 according to the second embodiment, as shown in FIG. 17, five two-axis guiding systems $4_1$, $4_2$, $4_3$, $4_4$, $4_5$ are disposed on each predetermined position on the table base plate 2. As for these five two-axis guiding systems $4_1$, $4_2$, $4_3$, $4_4$, $4_5$, as shown in FIG. 17, the position $P_1$ in which the first two-axis guiding system $4_1$ supports the movable table 3 freely rotatably is disposed so as to be located in the center O of a circle C in an initial state before the driving is started, and the positions $P_2$, $P_3$, $P_4$, $P_5$ in which the second-fifth two-axis guiding systems $4_2$, $4_3$, $4_4$, $4_5$, support the movable table 3 freely rotatably are disposed so as to be located on the same circle C around the rotation center O. The second and third two-axis guiding systems $4_2$, $4_3$ are disposed on the circle C formed with respect to the rotation axis O around which the movable table 3 rotates and at positions different by 180° on the Y axis. The fourth and fifth two-axis guiding systems $4_4$, $4_5$ are disposed on the circle C concentric with the rotation center of the movable table 3 and at positions different by 180° on the X axis.

Of the aforementioned five two-axis guiding systems, the first-third two-axis guiding systems $4_1$, $4_2$, $4_3$ use a track rail 80 in the Y-axis direction in common and this track rail 80 in the Y-axis direction is mounted so as to span an entire length (Y-axis direction) of the table base plate 2, in the center with respect to the width direction (X-axis direction) of the table base plate 2. In the fourth two-axis guiding system $4_4$, the track rail 81 in the Y-axis direction is mounted near an end in the width direction of the table base plate 2 in such a condition that it is shorter than the track rail 80 of the first two-axis guiding system $4_1$ and parallel thereto. Further, in the fifth two-axis guiding system $4_5$, the track rail 82 in the Y-axis direction is mounted near the other end in the width direction of the table base plate 2 and along the length direction of the table base plate 2 in such a condition that it is shorter than the track rail 80 of the first two-axis guiding system $4_1$ and parallel thereto.

The five two-axis guiding systems $4_1$, $4_2$, $4_3$, $4_4$, $4_5$ are constructed in the same way, comprising the track rails 80, 81, 82 in the Y-axis direction mounted on the table base plate 2 as described above, moving blocks 83, 84, 85, 86, 87 mounted to the track rails 80, 81, 82 movably in the Y-axis direction through a plurality of the balls as rolling bodies, and shorter track rails 88, 89, 90, 91, 92 in the X-axis direction mounted on the moving blocks 83, 84, 85, 86, 87 through a plurality of the balls as the rolling bodies in a direction perpendicular to the aforementioned track rails 80, 81, 82.

The two-axis guiding systems $4_1$, $4_2$, $4_3$, $4_4$, $4_5$ are constructed in the same manner as the first embodiment, and comprise the track rails 80, 81, 82 in the Y-axis direction, moving blocks 83, 84, 85, 86, 87 and track rails 88, 89, 90, 91, 92 in the X-axis direction. They are linear guiding systems for guiding the movable table 3 movably along two axes (XY axes) which are perpendicular to each other and supporting the movable table 3 rotatably. The track rails 88, 89, 90, 91, 92 in the X-axis direction of the two-axis guiding systems $4_1$, $4_2$, $4_3$, $4_4$, $4_5$ support the movable table 3 rotatably through the rotation systems 31.

The movable table unit 1 according to the second embodiment comprises the first driving means 5 for driving the track rail 88 of the first two-axis guiding system $4_1$ along the Y axis ensuring a large traveling amount and two second driving means 6, 7 for driving the track rails 89, 90 of the second and third two-axis guiding system $4_2$, $4_3$ independently along the X axis.

As shown in FIGS. 17, 18, the first and second driving means 5, 6, 7 comprise driving motors 45, 55, 56 and feeding screw mechanisms 46, 57, 58 for converting rotation of the driving motors 45, 55, 56 to linear motion like the first embodiment. Meanwhile, the fourth and fifth two-axis guiding systems $4_4$, $4_5$ have no driving means.

In the movable table unit according to the second embodiment having such a structure, operations for rotating the movable table at a position other than the original point and moving it in parallel after rotating at a predetermined angle can be carried out by a simple control. Also, an operation for moving the rotation center linearly along two axes can be carried out and further, the movable table can be moved largely along a single axis.

That is, in the movable table unit 1 according to the second embodiment, the movable table 3 is stopped at a position shown in FIG. 17 for example, in an initial state before the movable table 3 is moved. For example, in case where the movable table 3 is moved in parallel along the Y axis without changing the posture thereof, the driving motor 45 of the first driving means 5 for driving the moving block 84 of the first two-axis guiding system $4_1$ along the Y-axis is driven in a predetermined direction so as to rotate the long screw shaft 49 joined to the motor shaft 53 of the driving motor 45. Then, the nut 48 meshing with this screw shaft 49 is moved in the Y-axis direction with rotations of the screw shaft 49, so that the moving block 10 of the first two-axis guiding system $4_1$ fixed to the nut 48 meshing with the screw shaft 49 through the brackets 47 is also moved in the Y-axis direction. As a result, the movable table 3 joined to the moving block 10 of the first two-axis guiding system $4_1$ is moved by only a predetermined amount y along the Y axis with the moving block 10 of the first two-axis guiding system $4_1$.

Next, in case where the movable table 3 is moved in parallel along the X axis, as shown in FIG. 17, by driving the driving motors 55, 56 of the second driving means 6, 7 for driving the track rails 89, 90 in the X-axis direction of the second and third two-axis guiding systems $4_2$, $4_3$, along the X axis, in the same direction, the screw shafts 63, 64 joined to motor shafts (not shown) of the driving motors 55, 56 are rotated. Then, because the nuts 61, 62 meshing with the screw shafts 63, 64 are joined to the moving blocks 84, 85 of the second and third two-axis guiding systems $4_2$, $4_3$ which are not moved in the X-axis direction, through the brackets 59, 60, conversely the screw shafts 63, 64 meshing with the nuts 61, 62 are moved in the same direction along the X axis with rotations thereof. Consequently, the driving motors 55, 56 joined to the screw shafts 63, 64 are also moved in the same direction along the X axis with the screw shafts 63, 64. As a result, the movable table 3 joined to the track rails 89, 90 in the X-axis direction rotatably through the rotation systems 31 is moved by only a predetermined amount x in the same direction along the X axis, together with the track rails 89, 90 in the X-axis direction of the second and third two-axis guiding systems $4_2$, $4_3$ joined to the driving motors 55, 56 through the brackets 65, 66.

Further, in case where the movable table 3 is rotated around a rotation axis perpendicular to a plane formed by the X and Y axes, by driving the driving motors 55, 56 of the second driving means 6, 7 for driving the track rails 89, 90 in the X-axis direction of the second and third two-axis guiding systems $4_2$, $4_3$ in opposite directions to each other, the screw shafts 63, 64 joined to motor shafts (not shown) of the driving motors 55, 56 are rotated in opposite directions to each other.

Because the nuts 61, 62 meshing with the screw shafts 63, 64 of the second driving means 6, 7 are joined to the moving blocks 84, 85 of the second and third two-axis guiding systems $4_2$, $4_3$ which are not moved in the X-axis direction through the brackets 59, 60, conversely, the screw shafts 63, 64 meshing with the nuts 61, 62 are moved in opposite directions to each other along the X axis with rotations thereof. Thus, the driving motors 55, 56 joined to the screw shafts 63, 64 are moved in opposite directions to each other along the X axis together with the screw shafts 63, 64. As a result, the movable table 3 joined to the track rails 89, 90 in the X-axis direction rotatably through the rotation systems 31 is moved by only a predetermined amount x in opposite directions along the X axis, together with the track rails 89, 90 in the X-axis direction of the second and third two-axis guiding systems $4_2$, $4_3$ joined to the driving motors 55, 56 through the brackets 65, 66.

As described above, the movable table 3 is guided movably along the two axes, X and Y axes and supported rotatably by the five two-axis guiding systems $4_1$, $4_2$, $4_3$, $4_4$, $4_5$. For example, the point $P_2$ supported by the second two-axis guiding system $4_2$ is moved leftward in FIG. 11 by the second driving means 6 and the point $P_3$ supported by the third two-axis guiding system $4_3$ is moved leftward in FIG. 11 by the third driving means 7. Because the second and third two-axis guiding systems $4_2$, $4_3$ are disposed on the circle C formed relative to the rotation axis O around which the movable table 3 is rotated and at positions different by 180° on the Y axis. Therefore, forces applied to the points $P_2$, $P_3$ in which the second and third two-axis guiding systems $4_2$, $4_3$ support the movable table 3 rotatably become rotation moment forces for directly rotating the movable table 3. Thus, in the movable table 3 mentioned above, rotation moment forces for rotating the movable table 3 are applied to the points $P_2$, $P_3$ supported rotatably, by the second driving means 6, 7 as shown in FIG. 17. As a result, the movable table 3 is rotated in a counterclockwise direction in FIG. 17.

In case where the movable table 3 is moved in an arbitrary direction on the XY plane and simultaneously rotated in the direction θ around the rotation axis O in the movable table unit 1, an operation for moving the movable table 3 in the X-axis direction, an operation for moving the movable table 3 in the Y-axis direction and an operation for rotating the movable table 3 in the direction θ may be combined.

That is, in case where the movable table 3 is moved in an arbitrary direction on the XY plane and simultaneously rotated in the direction θ around the rotation axis O in the movable table unit 1, first of all, the first driving means 5 is driven so as to move the movable table 3 in the Y-axis direction, then second driving means 5, 6 are driven in the same direction so as to move the movable table 3 in the X-axis direction and after that, the second driving means 6, 7 are driven in opposite directions to each other so as to rotate the movable table 3 by a predetermined amount around the rotation axis O. As a result, the motion control in the X-axis direction, Y-axis direction and in the direction θ can be carried out independently thereby facilitating the motion control of the movable table 3.

As described above, in the movable table unit 1 according to the second embodiment, an operation for rotating the movable table 3 at a position other than the original point and an operation for moving it in parallel after rotating at a predetermined angle can be carried out by a simple control. Further, in the movable table unit 1, by driving only the first driving means 5, the movable table 3 can be moved linearly in the Y-axis direction easily. By driving the second driving means 6, 7 in the same direction, the movable table 3 can be moved linearly in the X-axis direction easily. Further, because the track rail 80 in the Y-axis direction of the first two-axis guiding system $4_1$ driven by the first driving means 5 is formed in a long length, the movable table 3 can be moved largely along a single axis.

In the second embodiment, when rotating the movable table 3, only two second driving means 6,7 have to be driven and it is not necessary to drive the first driving means 5 in addition to the two second driving means 6, 7 unlike the first embodiment. Thus, the rotation of the movable table 3 can be carried out further easily.

Further, according to the second embodiment, as plural two-axis guiding systems, the fourth and fifth two-axis guiding systems are disposed on the right and left sides of the first-third two-axis guiding systems. Thus, the movable table can be supported across an entire width thereof and the motion of the movable table can be further stabilized. This is particularly effective for use of a wide table or increasing the load capacity or the like.

Although the second embodiment has been described about a case in which as plural two-axis guiding systems, the fourth and fifth two-axis guiding systems are disposed on the right and left sides of the first-third two-axis guiding systems, the present is not restricted to this example, but it is possible to eliminate the fourth and fifth two-axis guiding systems by using a wide track rail in the Y-axis direction for the first-third two-axis guiding systems or narrowing the width of the movable table.

Because the structure and operation are the same as the first embodiment, a description thereof is omitted.

Third Embodiment

Figure 19:
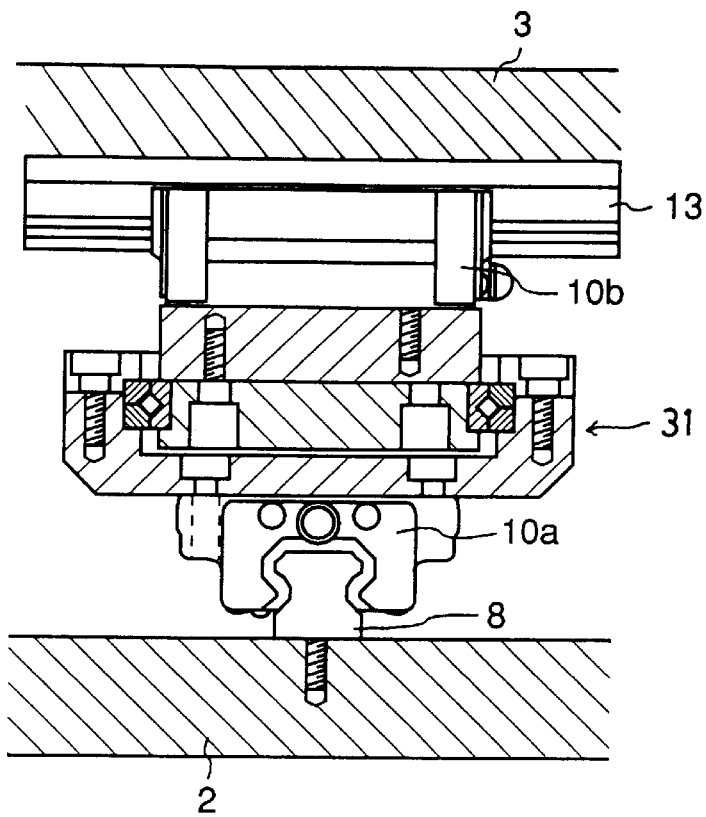
FIG. 19 is a front sectional view showing the two-axis guiding system according to the fourth embodiment of the movable table unit of the present invention.
Figure 20:
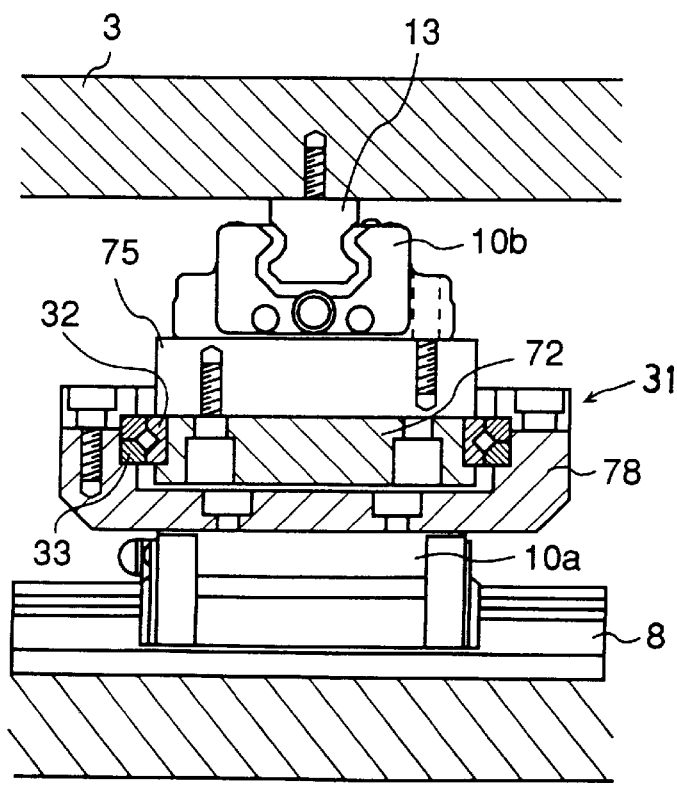
FIG. 20 is a side sectional view showing the two-axis guiding system according to the fourth embodiment of the movable table of the present invention.

FIGS. 19, 20 show a third embodiment of the present invention and the same reference numerals are attached to the same components as the first embodiment. Although this third embodiment is the same as the first embodiment in the structures of the first track rail, moving block and the second track rail, the rotation system is not provided between the movable table and two-axis guiding system, and therefore this point is different from the first embodiment.

That is, the movable table unit 1 of the third embodiment comprises first moving block 10a and second moving block 10b, which are upper and lower divisions of the two-axis guiding system 4. The aforementioned rotation system 31 is disposed between the first moving block 10a and second moving block 10b. The other structure and operation are the same as the first embodiment, and therefore a description thereof is omitted.

What is claimed is:

1. A movable table unit comprising:
   a table base plate;
   a movable table supported movably on said table base plate;
   a first track rail installed on the table base plate along an Y axial direction;
   a plurality of rotating and two-axis guiding systems guided by the first track rail, for guiding the movable table along a different direction from the Y axial direction and supporting the movable table rotatably;
   a first driving means fixed to the table base plate for driving at least one of the rotating and two-axis guiding systems along the Y axial direction; and
   a plurality of second driving means fixed to the rotating and two-axis guiding systems for driving the movable table independently along the different direction from the Y axial direction,
   wherein each of the rotating and two-axis guiding systems comprises a moving block guided by the first track rail, a second track rail guided by the moving block along an X axial direction and a rotation system for supporting the movable table rotatably relative to the moving block, and
   wherein the rotation system is arranged between the movable table and the second track rail.

2. A movable table unit as claimed in claim 1, wherein a rotation center of each of the rotating and two-axis guiding systems are disposed on a rotation center of the movable table.

3. A movable table unit as claimed in claim 1, wherein the plurality of rotating and two-axis guiding systems are guided by the same first track rail.

4. A movable table unit as claimed in claim 1, wherein the first track rail is substantially fixed on a full length of the table base plate.

5. A movable table unit as claimed in claim 1, wherein the second track rails of the guiding systems are arranged parallel to each other.

* * * * *